(12) United States Patent
Stella et al.

(10) Patent No.: US 8,890,313 B2
(45) Date of Patent: Nov. 18, 2014

(54) THROUGH-HOLE ELECTRONIC DEVICE WITH DOUBLE HEAT-SINK

(71) Applicant: STMicroelectronics S.r.l., Agrate Brianza (IT)

(72) Inventors: Cristiano Gianluca Stella, San Gregorio di Catania (IT); Gaetano Pignataro, Trecastagni (IT); Maurizio Maria Ferrara, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/871,857

(22) Filed: Apr. 26, 2013

(65) Prior Publication Data

US 2013/0285229 A1    Oct. 31, 2013

(30) Foreign Application Priority Data

Apr. 27, 2012 (IT) .............................. MI2012A0712

(51) Int. Cl.
| H01L 23/24 | (2006.01) |
| H01L 23/495 | (2006.01) |
| H01L 23/367 | (2006.01) |
| H01L 23/433 | (2006.01) |

(52) U.S. Cl.
CPC ...... *H01L 23/3677* (2013.01); *H01L 23/49562* (2013.01); *H01L 2924/13091* (2013.01); *H01L 2224/48247* (2013.01); *H01L 2224/48091* (2013.01); *H01L 23/49575* (2013.01); *H01L 23/4334* (2013.01); *H01L 2924/13055* (2013.01)
USPC ........... 257/712; 257/713; 257/692; 257/724; 438/122; 438/107

(58) Field of Classification Search
CPC ..................... H01L 23/3677; H01L 27/0211
USPC ........... 257/712, 713, 692, 724; 438/122, 107
See application file for complete search history.

(56) References Cited

U.S. PATENT DOCUMENTS

| 4,268,850 | A | 5/1981 | Lazarek et al. |
| 6,072,240 | A | 6/2000 | Kimura et al. |
| 6,703,707 | B1 | 3/2004 | Mamitsu et al. |
| 6,919,631 | B1 * | 7/2005 | Hoffman et al. ............... 257/707 |

(Continued)

FOREIGN PATENT DOCUMENTS

| JP | 2001156219 A | 6/2001 |
| JP | 2004193476 A | 7/2004 |
| JP | 2005123233 A | 5/2005 |
| JP | 2008042074 A | 2/2008 |

*Primary Examiner* — Tu-Tu Ho
(74) *Attorney, Agent, or Firm* — Seed IP Law Group PLLC (57) ABSTRACT

An electronic device includes a first chip and a second chip, where each chip has a first conduction terminal on a first surface and a second conduction terminal on a second surface. An insulating body surrounds the first and second chip, a first heat-sink coupled with the first conduction terminals of the first and second chip, and a second heat-sink coupled with the second conduction terminals of the first and second chip. A portion of the first heat-sink and/or the second heat-sink being exposed from the insulating body. The electronic device includes a first conductive lead and a second conductive lead exposed from the insulating body for through-hole mounting of the electronic device on an electronic board, the first conductive lead being coupled with the first heat-sink and the second conductive lead being coupled with the second heat-sink.

24 Claims, 6 Drawing Sheets

(56) References Cited

U.S. PATENT DOCUMENTS

| | | |
|---|---|---|
| 7,564,124 B2 * | 7/2009 | Lee et al. ............... 257/675 |
| 2001/0040246 A1 * | 11/2001 | Ishii ..................... 257/192 |
| 2003/0122232 A1 | 7/2003 | Hirano et al. |
| 2004/0195649 A1 | 10/2004 | Miura et al. |
| 2006/0090102 A1 | 4/2006 | Wehrly, Jr. et al. |
| 2006/0138452 A1 | 6/2006 | Knapp et al. |
| 2007/0075419 A1 | 4/2007 | Fukuda et al. |
| 2007/0216013 A1 | 9/2007 | Funakoshi et al. |
| 2008/0007920 A1 | 1/2008 | Shiraki et al. |
| 2008/0054417 A1 * | 3/2008 | Lee et al. ............... 257/666 |
| 2009/0116197 A1 | 5/2009 | Funakoshi et al. |
| 2009/0302444 A1 | 12/2009 | Ueda et al. |
| 2011/0057713 A1 | 3/2011 | Kawanami et al. |
| 2011/0310565 A1 | 12/2011 | He |
| 2013/0285230 A1 * | 10/2013 | Stella et al. ............ 257/692 |

\* cited by examiner

THROUGH-HOLE ELECTRONIC DEVICE WITH DOUBLE HEAT-SINK

BACKGROUND

1. Technical Field

The present disclosure relates to the electronics field, and more specifically, to an electronic device that includes multiple heat sinks and multiple chips.

2. Description of the Related Art

Each electronic device typically comprises a chip, for example, of semiconductor material, on which one or more electronic components are integrated, and a package wherein the chip is embedded for protecting it and for allowing access to its terminals.

In this regard, the package typically comprises an insulating body having exposed leads, each one of which is electrically connected to a corresponding terminal of the chip (for example, by a "wire-bonding" connection technique). The leads of the package are used for connecting it (and hence the corresponding terminals of the chip) to external circuits. For such purpose, the electronic device is typically mounted on a printed circuit board (PCB) comprising such external circuits. In a typical implementation, based on through-hole technology (THT), the leads of the package comprise conductive leads suitable to be inserted into through-holes of the PCB and back-welded on it.

A very widespread class of electronic devices is represented by electronic devices for power applications (e.g., for motors control and power supplies), or power devices, which comprise electronic components able to withstand high operative currents and/or voltages, for example, of the order of 0.3-300 A and 12-1,500V, respectively.

As it is known, the power devices are subject to considerable heating during their operation. For this reason, they are typically designed and used in a way ensuring adequate heat dissipation properties (so as to avoid overheating phenomena to the corresponding chips that might cause malfunction or breakage).

For example, each through-hole power device is provided with a heat-sink connected to the chip for dissipating the heat produced by it during its operation outwards. For such purpose, the heat-sink typically comprises a plate exposed on a side surface of the insulating body free from the conductive leads. Furthermore, in use, such a power device is typically fixed to a plate of conductive material (also mounted on the PCB) in contact with the exposed plate (in this way, such plate acts both as a support member for the power device and as external heat-sink). For this purpose, the power device is usually provided with a through-hole for its fixing to the plate (for example, by screw or bolt).

As it is known, each one of such power devices comprises a single chip, which integrates a single electronic component. This is due both to technical reasons—for example, as the presence of the through-hole brings limitations in terms of usable space—and economic reasons. In some cases, this may cause some drawbacks.

In fact, some applications require very high operative voltage and current values, e.g., higher than the operative voltage and/or current of the single power device. In order to achieve such operative values, typically it is necessary to employ replicated structures of same power devices being separately mounted on the PCB; for example, in case of power transistors, this may be achieved by parallel connection thereof on the PCB.

However, a structure of this type is not completely satisfactory in terms of size and complexity.

BRIEF SUMMARY

One embodiment of the present disclosure is directed to providing an electronic device with at least two chips electrically coupled by two or more heat-sinks More specifically, an embodiment of the present disclosure is an electronic device comprising two or more chips each one comprising at least one first terminal and at least one second terminal on opposite surfaces of the chip; a first heat-sink (which a first conductive lead is electrically coupled with) and at least one second heat-sink (which a second conductive lead is electrically coupled with) are electrically coupled with the first terminal and with the second terminal, respectively, of each chip.

A further embodiment of the present disclosure is a complex system comprising one or more of such electronic devices.

A further embodiment of the present disclosure is a method for manufacturing such electronic devices.

BRIEF DESCRIPTION OF THE SEVERAL VIEWS OF THE DRAWINGS

The present disclosure, as well as further features and the advantages thereof, will be best understood with reference to the following detailed description, given purely by way of a non-restrictive indication, to be read in conjunction with the accompanying drawings (wherein, for the sake of ease, corresponding elements are denoted with equal or similar references, and their explanation is not repeated, and the name of each entity is generally used for denoting both type and attributes thereof—such as value, content and representation). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1A:
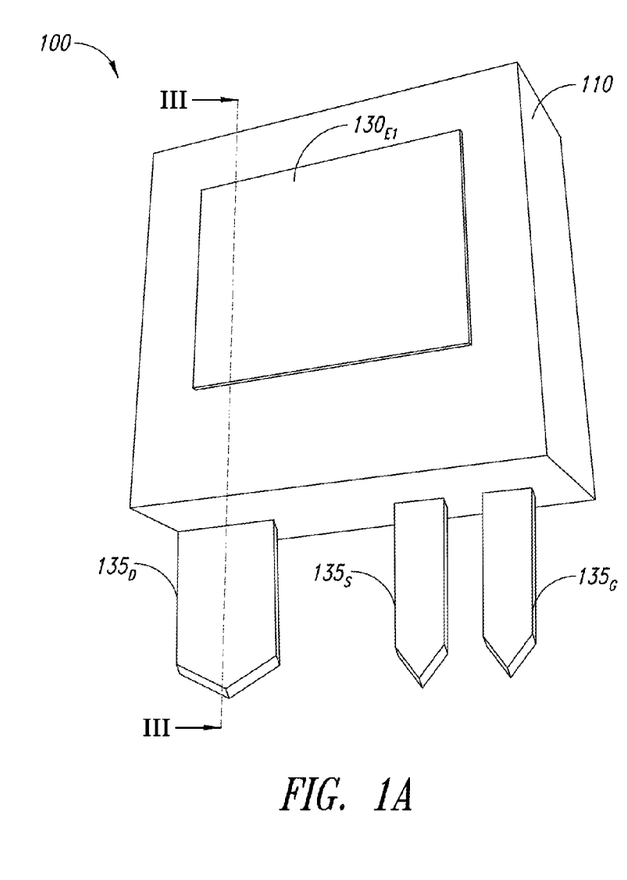
FIGS. 1A and 1B show perspective front and rear views, respectively, of an electronic device according to an embodiment of the disclosure.
Figure 1B:
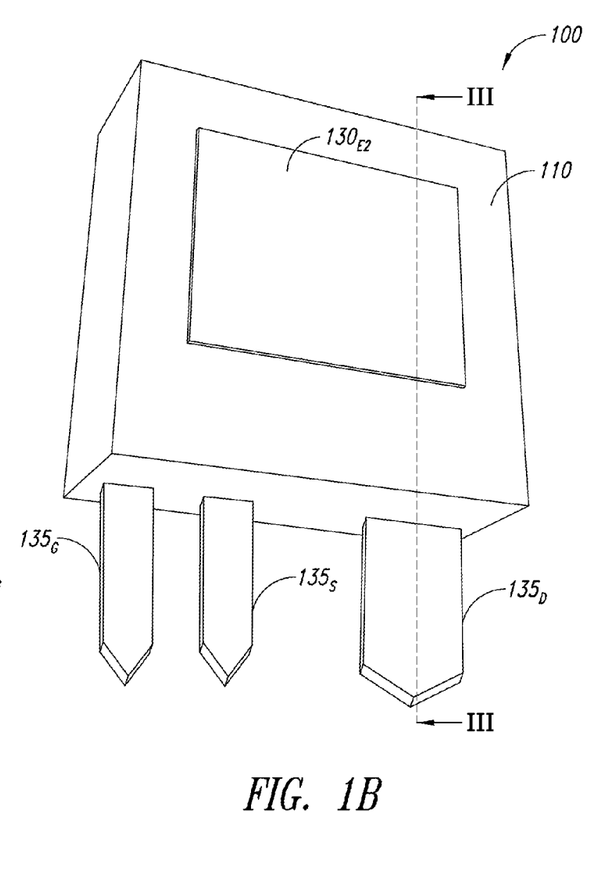

With particular reference to FIGS. 1A and 1B, they show perspective front and rear views, respectively, of an electronic device 100 according to an embodiment of the disclosure. For the sake of description ease, such figure will be discussed jointly with FIGS. 2 and 4, which show a perspective view with removed parts of the electronic device 100 and a detail of a possible variant thereof, respectively, and with FIG. 3, which shows a sectional view of such electronic device 100 along the section plane III-III of FIGS. 1A and 1B.

The electronic device 100 comprises a plurality of chips of semiconductor material, on each of which one or more electronic components are integrated.

In the exemplary but not limiting described embodiment, the electronic device 100 is a power device (e.g., for motors control and power supplies), and comprises two chips $105_1$, $105_2$ on each of which a single power component is integrated (such as a vertical structure MOS power transistor having high operative currents and/or voltages, for example, of the order of 0.3-300 A and 12-1,500V, respectively), and an insulating body (for example, of plastic material) 110 for embedding the chips $105_1$, $105_2$.

Each chip $105_1$, $105_2$ has a conduction terminal $T_{D1}$, $T_{D2}$ (e.g., a drain terminal of the power transistor) extending on a surface $115_{L1}$, $115_{L2}$ of the chip $105_1$, $105_2$, another conduction terminal $T_{S1}$, $T_{S2}$ (for example, a source terminal of the power transistor) extending on another surface $115_{U1}$, $115_{U2}$ of the chip $105_1$, $105_2$ opposite the surface $115_{L1}$, $115_{L2}$, and a control terminal $T_{G1}$, $T_{G2}$ (for example, a gate terminal of the power transistor) also extending on the surface $115_{U1}$, $115_{U2}$ of the chip $105_1$, $105_2$, substantially surrounding the terminal $T_{S1}$, $T_{S2}$. More particularly, as visible in FIG. 2 for the only terminal $T_{G1}$, each terminal $T_{G1}$, $T_{G2}$ comprises a frame arranged close to the side edge of the surface $115_{U1}$, $115_{U2}$ and a connection pad.

The configuration of the chips $105_1$, $105_2$ within the insulating body 110 is directed to obtaining two power transistors in parallel within the same power device 100 (i.e., with the terminal $T_{D1}$ electrically coupled with the terminal $T_{D2}$, and with the terminal $T_{S1}$ electrically coupled with the terminal $T_{S2}$).

In this regard, the power device 100 comprises a heat-sink 120 electrically coupled with the terminals $T_{D1}$ and $T_{D2}$, another heat-sink $125_1$ electrically coupled with the terminal $T_{S1}$ and a further heat-sink $125_2$ (similar to the heat-sink $125_1$) electrically coupled with the terminal $T_{S2}$ (with such heat-sinks $125_1$ and $125_2$ that, as will be explained shortly, may also form a single heat-sink).

Figure 2:
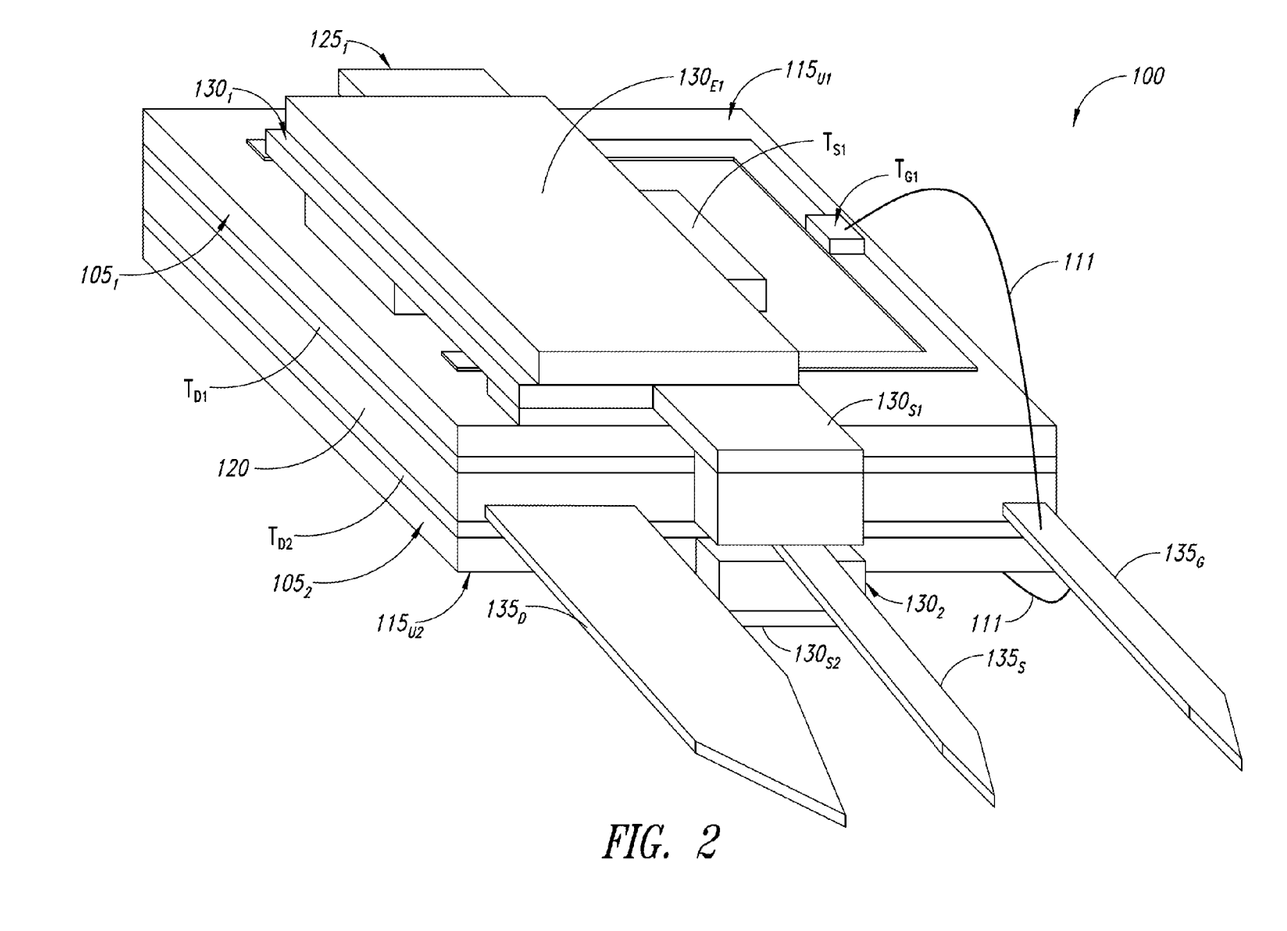
FIG. 2 shows a perspective view with removed parts of the electronic device of FIGS. 1A and 1B.
Figure 3:
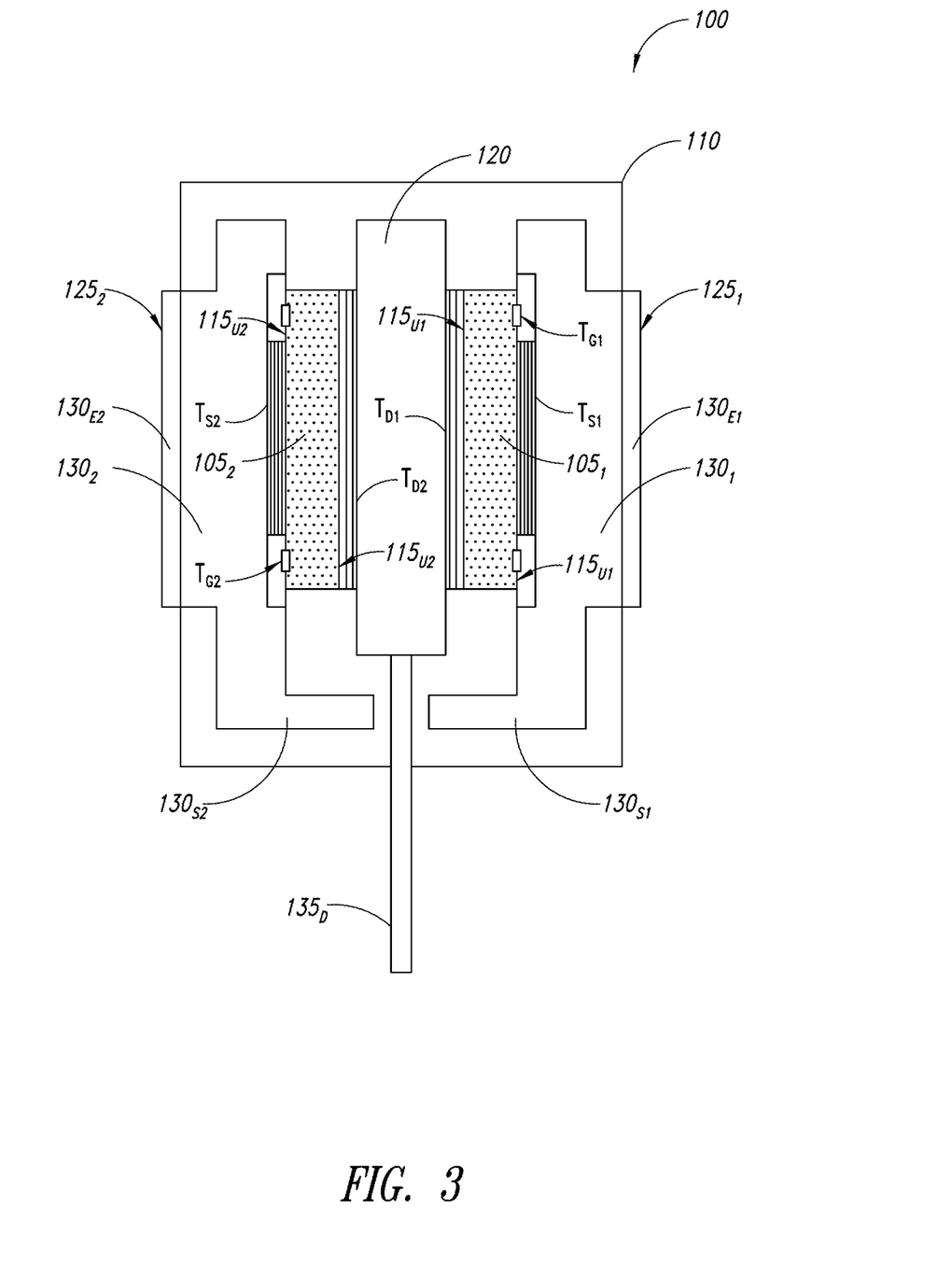
FIG. 3 shows a sectional view of the electronic device along the section plane III-III of FIGS. 1A and 1B.
Figure 4:
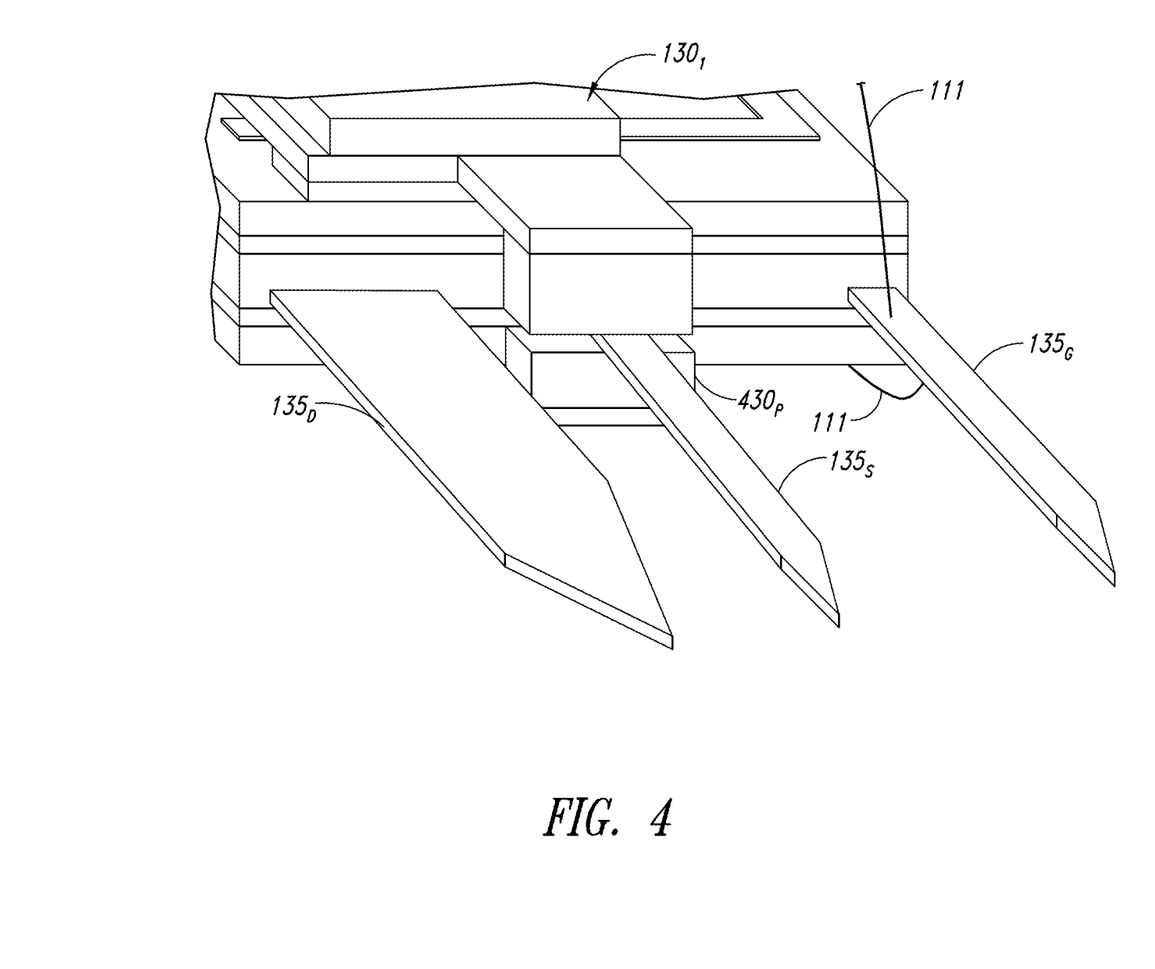
FIG. 4 shows, in a view similar to that of FIG. 2, a detail of a variant that may be implemented in the electronic device of FIGS. 1A and 1B.

More particularly, as best visible in FIG. 2 and FIG. 3, the surface $115_{L1}$ of the chip $105_1$ is oriented towards the surface $115_{L2}$ of the chip $105_2$, and the heat-sink 120 comprises a plate of (electrically and thermally) conductive material arranged between the (surfaces $115_{L1}$, $115_{L2}$ of the) chips $105_1$, $105_2$—for example, in contact with the terminals $T_{D1}$, $T_{D2}$. In this way, the heat-sink 120 is shared by, and electrically couples the terminals $T_{D1}$, $T_{D2}$; this allows obtaining a power device having small size.

Instead, each heat-sink $125_1$, $125_2$ comprises a dissipation member $130_1$, $130_2$ facing the surface $115_{U1}$, $115_{U2}$ of the chip $105_1$, $105_2$. Each dissipation member $130_1$, $130_2$, for example, also comprising a plate of (electrically and thermally) conductive material, contacts the terminal $T_{S1}$, $T_{S2}$ (for example, in part, as shown in FIG. 2, or totally), and extends over at least one portion of the terminal $T_{G1}$, $T_{G2}$ (for example, on two opposite portions of its frame, as shown in the figures) without contacting it; for such purpose, each dissipation member $130_1$, $130_2$ comprises one or more recesses—two, in the example at issue—for electrically isolating the terminal $T_{G1}$, $T_{G2}$ from the dissipation member $130_1$, $130_2$.

The power device 100 further comprises three conductive leads $135_D$, $135_S$, $135_G$ exposed from the insulating body 110, which are connected to respective terminals of the chips $105_1$, $105_2$ (so as to make the latter accessible from the outside of the power device 100) and are adapted to allow the mounting of the power device 100 on a circuit board (PCB), not shown, by through-hole technology (or THT).

More particularly, the conductive lead $135_D$ is integral (monolithic) with the heat-sink 120, thus resulting in electrical and thermal contact with the terminals $T_{D1}$, $T_{D2}$ optimally.

In this way, the conductive lead $135_D$ may act both as lead for accessing the terminals $T_{D1}$, $T_{D2}$, and as extension of the heat-sink 120 for better dissipating the heat outside the insulating body 110; for such purpose, the conductive lead $135_D$ is advantageously provided (as also illustrated in the figures) with a surface exposed from the insulating body 110 greater than the (standard) one of the conductive leads $135_S$ and $135_G$; for example, the area of the exposed surface of the conductive lead $135_D$ is equal to 1.5-3 times, preferably equal to 1.7-2.5 times, such as equal to 2 times the area of the exposed surface of the conductive leads $135_S$ and $135_G$.

The conductive lead $135_S$ directly contacts the heat-sink $125_1$, $125_2$. In this way, the conductive lead $135_S$ contacts the terminals $T_{S1}$, $T_{S2}$ through the heat-sink $125_1$, $125_2$, and hence without using wire connections, or wire bonding (which would introduce resistive and/or inductive parasitism that might adversely affect a driving of the power device 100, for example, by causing long switching times and high switching losses). In this regard, in the illustrated embodiment, each dissipation member $130_1$, $130_2$ comprises a member $130_{S1}$, $130_{S2}$ protruding (beyond an edge of the chip $105_1$, $105_2$) transversely from it towards the other dissipation member $130_2$, $130_1$, with the conductive lead $135_S$ that is interposed between, and directly contacts, the protruding member $130_{S1}$ and the protruding member $130_{S2}$. In a variant, shown in FIG. 4, the electronic device comprises, instead of the protruding member $130_{S1}$, $130_{S2}$, a bridge connection member $430_P$ between the dissipation member $130_1$ and the dissipation member $130_2$ (so as to form a single heat-sink associated with the source terminals), with the conductive lead $135_S$ that contacts such bridge connection member $430_P$ directly.

Finally, the conductive lead $135_G$ is electrically connected to the connection pads of the terminals $T_{G1}$, $T_{G2}$ within the insulating body 110 by wire bonding 111.

Therefore, in the described embodiments, the conductive lead $135_D$, $135_S$, $135_G$ is electrically coupled with the terminals $T_{D1}$, $T_{D2}$, with the terminals $T_{S1}$, $T_{S2}$ and with the terminals $T_{G1}$, $T_{G2}$, respectively, of the chips $105_1$, $105_2$; in this way, the power transistors integrated within the chips $105_1$, $105_2$ are connected in parallel with each other.

Such solution is advantageous in that the power device 100, as implementing a single power transistor having very high values of operative voltage and current, may be used in high performance applications. Moreover, such solution avoids the use, in such applications, of (a high number of) replicated structures of the same power devices separately mounted on the PCB (with consequent reduction of space occupation on it).

Finally, the power device 100 according to an embodiment of the present disclosure also comprises one or more portions of conductive material exposed from the insulating body 110 for dissipating the heat outside it. In the exemplary illustrated embodiment, the power device 100 is of DSC ("Dual Side Cool") type, which has two different portions exposed from the insulating body; more particularly, the dissipation member $130_1$ comprises an exposed portion $130_{E1}$ distal from the chip $105_1$, whereas the dissipation member $130_2$ comprises an exposed portion $130_{E2}$ distal from the chip $105_2$ (with such exposed portions $130_{E1}$ and $130_{E2}$ that are hence exposed on opposite side surfaces of the insulating body 110 orthogonal to a mounting direction of the power device 100 on the PCB). Such solution is advantageous as it provides high heat dissipation properties; in this way, the power device 100 does not necessarily require the use either of an auxiliary dissipation plate that, in the known solutions, is mounted on the PCB in contact with the power device, or of (cumbersome) through-holes within the insulating body 110 for the fixing to the same. Therefore, the power device 100 is remarkably compact and easy to make. In any case, it should be noted that the possibility of employing auxiliary dissipation plates in contact with the exposed portions $130_{E1}$, $130_{E2}$ is not excluded; for example, in the case of the power device 100 herein described wherein the exposed portions $130_{E1}$, $130_{E2}$ are electrically connected between each other, it is possible to foresee the use of containment structures (e.g., elastic bands) clamping the auxiliary dissipation plates between them thereby maximizing the adhesion to the respective exposed portions.

Figure 5A:
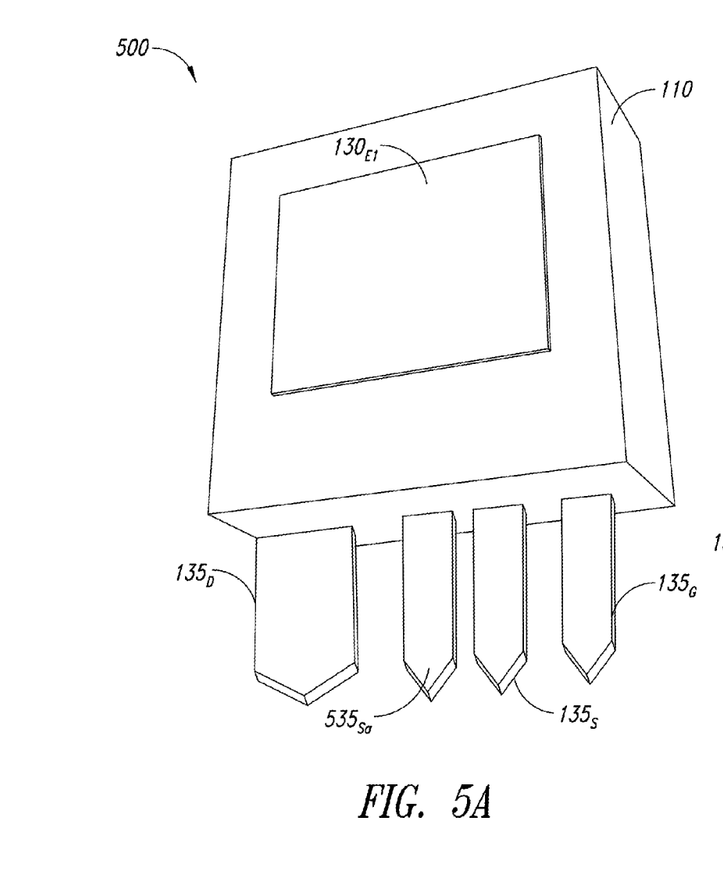
FIGS. 5A and 5B show perspective front and rear views, respectively, of an electronic device according to another embodiment of the disclosure.
Figure 5B:
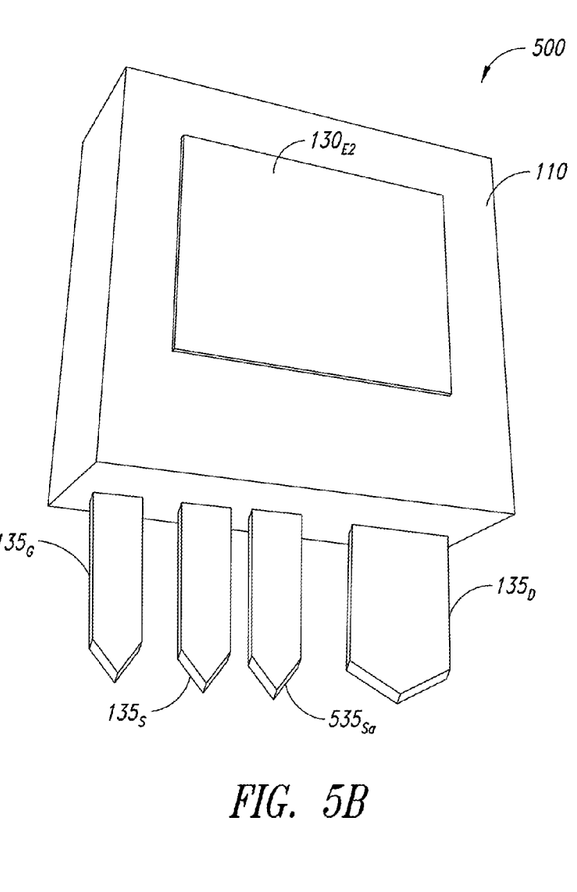
Figure 6:
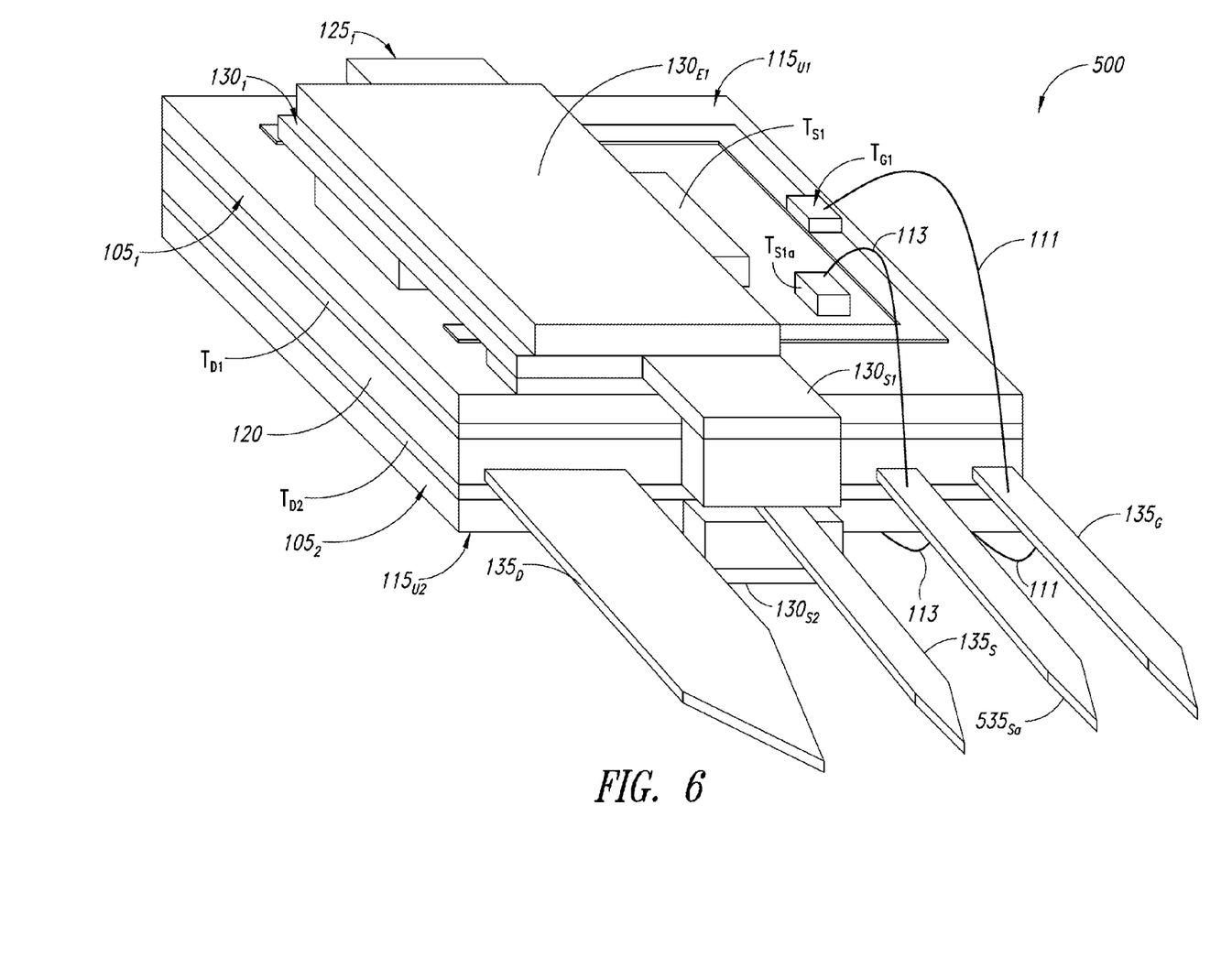
FIG. 6 shows a perspective view with removed parts of the electronic device of FIGS. 5A and 5B.

Turning to FIGS. 5A and 5B, they show perspective front and rear views, respectively, of an electronic device (for example, again a power device) 500 according to another embodiment of the disclosure. For the sake of description ease, such figures will be discussed jointly with FIG. 6, which shows a perspective view with removed parts of the power device 500.

The power device 500 is similar to the power device 100, but differs from the latter for the presence of an auxiliary source terminal $T_{S1a}$, $T_{S2a}$ on the surface $115_{U1}$, $115_{U2}$ of the chip $105_1$, $105_2$, respectively (only the terminal $T_{S1a}$ being visible in FIG. 5). The terminal $T_{S1a}$, $T_{S2a}$ is arranged within the frame of the terminal $T_{G1}$, $T_{G2}$, preferably separated from the terminal $T_{S1}$, $T_{S2}$.

As it is known, this terminal $T_{S1a}$, $T_{S2a}$ may be used, for example, for making differentiated conductive paths for control signals and power signals (i.e., the operation voltages and/or currents) induced by them.

In this regard, the power device 500 further comprises an auxiliary conductive lead $535_{Sa}$ electrically coupled with the terminal $T_{S1a}$, $T_{S2a}$. In the exemplary illustrated embodiment, the conductive lead $535_{Sa}$ is electrically connected to the terminal $T_{S1a}$, $T_{S2a}$ by wire bonding.

The power device 500 is further advantageous with respect to that of the previous embodiment as it has reduced power losses and lower operating temperatures, and hence greater durability and reliability.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. In any case, ordinal qualifiers or the like are merely used as labels for distinguishing elements with the same name but do not connote any priority, precedence or order. Moreover, it is expressly intended that specific elements and/or method steps described in connection with any embodiment of the disclosed solution may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment of the present disclosure proposes an electronic device comprising at least one chip of semiconductor material and at least one further chip of semiconductor material on each of which at least one electronic component is integrated. Each chip comprises at least one first conduction terminal on a first surface of the chip and at least one second conduction terminal on a second surface of the chip opposite the first surface, and an insulating body embedding said at least one chip and said at least one further chip. In one embodiment of the disclosure, the electronic device further comprises a first heat-sink electrically coupled with said at least one first conduction terminal of said at least one chip and with said at least one first conduction terminal of said at least one further chip, and at least one second heat-sink electrically coupled with said at least one second conduction terminal of said at least one chip and with said at least one second conduction terminal of said at least one further chip; at least one between said first heat-sink and said at least one second heat-sink comprises at least one portion exposed from the insulating body. The electronic device further comprises a first conductive lead and a second conductive lead exposed from the insulating body for through-hole mounting of the electronic device on an electronic board; the first conductive lead is electrically coupled with the first heat-sink and the second conductive lead is electrically coupled with said at least one second heat-sink.

Anyway, similar considerations apply if the electronic device has a different structure or comprises equivalent components. In any case, any of its components may be separated into several elements, or two or more components may be combined into a single element; in addition, each component may be replicated to support the execution of the corresponding operations in parallel. It should also be noted that (unless stated otherwise) any interaction between different components generally does not need be continuous, and it may be direct or indirect via one or more intermediaries.

For example, number and type of chips is not limiting for the present disclosure, as well as number and type of electronic components being integrated on each one of them. Moreover, the illustrated shape of the insulating body should not be construed limitatively for the present disclosure, as well as type of materials and production process that may be employed for its making.

The heat-sinks may be of any type, shape and size, and in any position and number; for example, in case where the electronic device comprises more chips and/or more electronic components, a greater number of second heat-sinks may be provided.

The heat-sinks may be electrically coupled with the respective conduction terminals in any way. In particular, they may also be not in direct contact with (the respective terminal of) the chip; for example, intermediate layers may be provided (e.g., coupling layers and/or soldering layers) in order to ensure good adhesion properties (and hence efficient mechanical and/or electric coupling). For the same reasons, each one of such intermediate layers may comprise respective multi-layer structures. Such electrical coupling may also define any type of electrical connection between the electronic components (for example, in series).

The number of conductive leads is not limiting for the present disclosure, as well as their connections to the terminals of the chips (with any combination thereof that is possible).

According to an embodiment of the present disclosure, the first surface of said at least one chip is oriented towards the first surface of said at least one further chip; the first heat-sink is arranged between said at least one chip and said at least one further chip. Said at least one second heat-sink comprises a dissipation member facing the second surface of said at least one chip and a further dissipation member facing the second surface of said at least one further chip. Said at least one exposed portion comprises an exposed portion of the dissipation member being distal from said at least one chip and an additional exposed portion of the further dissipation member being distal from said at least one further chip.

Anyway, the chips may have different arrangements. For example, it is possible to provide for implementations wherein the chips are side by side, or stacked (i.e., with the first surface of a chip oriented towards the second surface of the other chip); this may be useful, for example, for implementing transistors (or other components) in series with each other within the electronic device.

Moreover, the exposed portion may face any other free surface of the insulating body. Such exposed portion may be at the level of the insulating body, protruding from the same, or even slightly recessed.

According to an embodiment of the present disclosure, the first conductive lead and the second conductive lead have a first exposed surface and a second exposed surface, respectively, being exposed from the insulating body; the first exposed surface is greater than the second exposed surface. Moreover, the first conductive lead is monolithic with the first heat-sink.

Anyway, the principles of the solution according to an embodiment of the present disclosure apply for any shape and size of the conductive leads (for example, the first conductive lead and the second conductive lead may have the same exposed surface).

Moreover, in a basic implementation, the first conductive lead may be connected (e.g., welded) to the first heat-sink (for example, during embedding of the chips).

According to an embodiment of the present disclosure, the second conductive lead contacts said at least one second heat-sink directly.

Anyway, the second conductive lead may contact the at least one second heat-sink indirectly (for example, by wire bonding).

According to an embodiment of the present disclosure, each dissipation member comprises a plate facing the second surface of said corresponding at least one chip and a member transversely protruding from the plate towards the other dissipation member; the second conductive lead is interposed between and directly contacts the protruding member of the dissipation member and the protruding member of the further dissipation member.

Anyway, the second conductive lead may contact the protruding member of the dissipation member and the protruding member of the further dissipation member differently (for example, by folding thereof).

According to an embodiment of the present disclosure, said at least one second heat-sink further comprises a bridge connection member between the dissipation member and the further dissipation member; the second conductive lead directly contacts the bridge connection member.

Anyway, the second conductive lead may contact the bridge connection member differently (for example, by folding thereof).

However, the electrical coupling between the second conductive lead and said at least one second heat-sink may be achieved in any other way; for example, it is possible to connect the two dissipation members by another bridge connection member from the side opposite the conductive leads, and hence to connect the second conductive lead to only one of such dissipation members.

According to an embodiment of the present disclosure, the at least one electronic component comprises at least one power transistor.

Anyway, one or more different power components (for example, MOSFET, IGBT, BJT, or JFET transistors, diodes, and/or thyristors) may be integrated on the chips.

Although in the description explicit reference has been made to specific operative voltages and/or currents, they should not to be understood limitatively. For example, the same considerations apply for power components that, thanks to more accurate, reliable and evolved production processes, allow obtaining operative voltages and/or currents even greater than the current ones (and hence exceeding 1,500V and 300 A, respectively).

Anyway, although the described solution is particularly, but not exclusively, advantageous for chips integrating power components, the principles of the present disclosure may be applied to any electronic device wherein it is necessary to obtain high performance and small size.

According to an embodiment of the present disclosure, each chip further comprises at least one control terminal on the second surface of the chip; the corresponding dissipation member extends over at least one portion of the control terminal and comprises at least one recess for electrically isolating said at least one portion of the control terminal from the dissipation member. The electronic device further comprises a control conductive lead and wire bonding means electrically connecting the control conductive lead to said at least one control terminal of said at least one chip and to said at least one control terminal of said at least one further chip within the insulating body.

Anyway, although the control terminal has been described as extending around the second conduction terminal, this does not mean that this is the only possible way to make it. In this regard, the control terminal may comprise conductive fingers, for example, inwardly extending towards the second conduction terminal and being kept electrically separated from it through a proper insulating material. In such case, the second heat-sink (i.e., each dissipation member) may comprise further recesses for at least partly housing such fingers.

In general, it is possible to provide any number of additional recesses (with respect to those illustrated and/or described) properly distributed according to specific requirements to be met, or conversely no recess may be provided when the control terminal is completely separated.

Moreover, each control terminal may be connected to the control conductive lead in another way (for example, by conductive plates with respective portions properly extended, shaped, and/or folded—as described for the second conductive lead).

In a different embodiment, the at least one second heat-sink may contact the control terminal (for example, for making diode-connected configurations).

According to an embodiment of the present disclosure, each chip comprises a further second conduction terminal on the second surface. The electronic device comprises a further second conductive lead and further wire bonding means electrically connecting the further second conductive lead to said at least one further second terminal of said at least one chip and to said at least one further second terminal of said at least one further chip within the insulating body.

Anyway, the further second conduction terminal may be omitted in a basic implementation. Moreover, each further second conduction terminal may be connected to the further second conductive lead in another way (for example, through conductive plates with respective portions properly extended, shaped, and/or folded—as described for the at least one second conductive lead).

It should be readily understood that the proposed structure may be part of the design of an integrated circuit. The design may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits on the same chip, or it may be mounted in intermediate products (such as mother boards) and coupled with one or more other chips (such as a processor). In any case, the integrated circuit is suitable to be used in complex systems (such as automotive applications or microcontrollers).

An embodiment of the present disclosure proposes a system (for example, a mobile phone, a computer, and the like) comprising one or more of such electronic devices.

However, the electronic device may be used in any other application, and it may obviously be made and marketed as a stand-alone product.

An embodiment of the present disclosure proposes a method for manufacturing an electronic device. The method comprises the following steps. Firstly, at least one chip of semiconductor material and at least one further chip of semiconductor material are provided on each of which at least one electronic component is integrated; each chip comprises at least one first conduction terminal on a first surface of the chip and at least one second conduction terminal on a second surface of the chip opposite the first surface. Said at least one chip and said at least one further chip are embedded within an insulating body. In the solution according to an embodiment of the disclosure, the method further comprises electrically coupling a first heat-sink with said at least one first conduction terminal of said at least one chip and with said at least one first conduction terminal of said at least one further chip, and at least one second heat-sink with said at least one second conduction terminal of said at least one chip and with said at least one second conduction terminal of said at least one further chip; at least one between said first heat-sink and said at least one second heat-sink comprises at least one portion exposed from the insulating body. Moreover, the method comprises electrically coupling a first conductive lead and a second conductive lead exposed from the insulating body for through-hole mounting of the electronic device on an electronic board with the first heat-sink and with said at least one second heat-sink, respectively.

Anyway, the solution according to an embodiment of the disclosure lends itself to be implemented through an equivalent method (by using similar steps, removing some non-essential steps, or adding additional optional steps); moreover, the steps may be performed in a different order, in parallel or overlapped (at least in part).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a first chip and a second chip of semiconductor material each of which includes electronic components, each chip including a first conduction terminal on a first surface of the chip and a second conduction terminal on a second surface of the chip opposite the first surface of the chip; and
an insulating body encapsulating the first chip and the second chip; and
a first heat-sink electrically coupled with the first conduction terminal of said first chip and with the first conduction terminal of said second chip;
a second heat-sink electrically coupled with the second conduction terminal of said first chip and with the second conduction terminal of said second chip, at least one of the first heat-sink and the second heat-sink including a portion exposed from the insulating body; and
a first conductive lead and a second conductive lead configured to extend from the insulating body and configured to mount the electronic device with a through-hole mount on an electronic board, the first conductive lead being electrically coupled with the first heat-sink and the second conductive lead being electrically coupled with the second heat-sink, the first conductive lead and the second conductive lead having a first exposed surface and a second exposed surface, respectively, that are exposed from the insulating body, the first exposed surface being greater than the second exposed surface.

2. The electronic device according to claim 1 wherein:
the first surface of said first chip is oriented towards the first surface of said second chip, the first heat-sink being arranged between said first chip and said second chip, and
said second heat-sink includes a first dissipation member facing the second surface of said first chip and a second dissipation member facing the second surface of said second chip, said exposed portion includes a first exposed portion of the first dissipation member distal from said first chip and a second exposed portion of the second dissipation member distal from said second chip.

3. The electronic device according to claim 1 wherein the first conductive lead is monolithic with the first heat-sink.

4. The electronic device according to claim 2 wherein the second conductive lead contacts said second heat-sink directly.

5. The electronic device according to claim 4 wherein each of the first and second dissipation members includes a plate facing the second surface of said corresponding first chip and a member transversely protruding from the plate towards the other dissipation member, the second conductive lead being interposed between and directly contacting the protruding member of the first dissipation member and the protruding member of the second dissipation member.

6. The electronic device according to claim 4 wherein said second heat-sink further comprises a bridge connection member between the first dissipation member and the second dissipation member, the second conductive lead directly contacting the bridge connection member.

7. The electronic device according to claim 1 wherein the electronic components include a power transistor.

8. The electronic device according to claim 2 wherein each of the first and second chips further includes a control terminal on the second surface of the chip, the corresponding dissipation member extending over a portion of the control terminal and including at least one recess to electrically isolate the portion of the control terminal from the dissipation member, and wherein the electronic device includes a control conductive lead and wire bonding configured to electrically connect the control conductive lead to said control terminal of said first chip and to said control terminal of said second chip within the insulating body.

9. The electronic device according to claim 8 wherein each of the first and second chips include a third conduction terminal on the second surface, and wherein the electronic device a third conductive lead and wire bonding configured to electrically connect the third conductive lead to said third terminal of said first chip and to said third terminal of said second chip within the insulating body.

10. A method, comprising:
providing a first chip and a second chip of semiconductor material, each of which includes electronic components, each chip including a first conduction terminal on a first surface of the chip and a second conduction terminal on a second surface of the chip opposite the first surface; and
embedding said first chip and said second chip within an insulating body;
electrically coupling a first heat-sink with said first conduction terminal of said first chip and with said first conduction terminal of said second chip; and
electrically coupling a second heat-sink with said second conduction terminal of said first chip and with said second conduction terminal of said second chip;
forming a surface of at least one of the first heat-sink and the second heat-sink to be exposed from the insulating body; and
electrically coupling a first conductive lead and a second conductive lead with the first heat-sink and with said second heat-sink, respectively, the first and second conductive leads extending from the insulating body for through-hole mounting of the electronic device on an electronic board, the first conductive lead and the second conductive lead having a first exposed surface and a second exposed surface, respectively, that are exposed from the insulating body, the first exposed surface being greater than the second exposed surface.

11. The method of claim 10, further comprising:
positioning the first surface of said first chip towards the first surface of said second chip;
positioning the first heat-sink between said first chip and said second chip; and
forming a first dissipation member and a second dissipation member as part of the second heat sink, the first dissipation member facing the second surface of said first chip and the second dissipation member facing the second surface of said second chip.

12. The method of claim 11 wherein forming the portion exposed from the insulating body includes forming a first exposed portion of the first dissipation member distal from said first chip and a second exposed portion of the second dissipation member distal from said second chip.

13. The method of claim 10 wherein electrically coupling the second conductive lead includes directly contacting the second heat-sink.

14. A device, comprising:
a package that includes:
a first die;
a second die;
a first heat sink positioned between the first die and the second die;
a second heat sink having a first portion coupled to the first die and a second portion coupled to the second die, the first die, the first heat sink, and the second die being between the first portion and the second portion of the second heat sink; and
first and second conductive leads extending from the package, the first and second conductive leads being to the first and second sinks, respectively, the first conductive lead having a width that is greater than a width of the second conductive lead.

15. The device of claim 14 wherein the second heat sink includes a first external surface that is exposed through the package on a first side of the package and a second external surface that is exposed through the package on a second side of the package.

16. The device of claim 15 wherein the first and second conductive leads extend from a single end of the package.

17. The device of claim 14 wherein the first conductive lead and the second conductive lead are directly coupled to the first heat sink and the second heat sink, respectively.

18. The device of claim 14 further comprising a third conductive lead coupled to a first gate terminal on the first die and a second gate terminal on the second die.

19. A device, comprising:
a package that includes:
a first die;
a second die;
a first heat sink positioned between the first die and the second die;
a second heat sink having a first portion coupled to the first die and a second portion coupled to the second die, the first die, the first heat sink, and the second die being between the first portion and the second portion of the second heat sink, the first portion and the second portion extending over a first terminal on the first die and a second terminal on the second die, respectively, and the first portion and the second portion each including a recess to electrically isolate the first terminal and the second terminal, respectively.

20. The device of claim 19, further comprising first and second conductive leads extending from the package, the first conductive lead has a first exposed surface that is greater than a second exposed surface of the second conductive lead.

21. The device of claim 19 wherein the second heat sink includes a first external surface that is exposed through the package on a first side of the package and a second external surface that is exposed through the package on a second side of the package.

22. A device, comprising:
a package that includes:
a first transistor having a drain terminal and a source terminal, the drain terminal being on a first surface of the first transistor, and the source terminal being on a second surface of the first transistor;
a second transistor having a drain terminal and a source terminal, the drain terminal being on a first surface of the second transistor, and the source terminal being on a second surface of the second transistor;
a first heat sink positioned between the first transistor and the second transistor, the first heat sink having a first surface facing the drain terminal of the first transistor, and the first heat sink having a second surface facing the drain terminal of the second transistor; and
a second heat sink having a first portion coupled to the first transistor and a second portion coupled to the second transistor, the first transistor, the first heat sink, and the second transistor being between the first portion and the second portion of the second heat sink, the first portion of the second heat sink facing the source terminal of the first transistor, and the second portion of the second heat sink facing the source terminal of the second transistor.

23. The device of claim 22, wherein the second heat sink includes a first external surface that is exposed through the package on a first side of the package and a second external surface that is exposed through the package on a second side of the package.

24. The device of claim 22 further comprising a first conductive lead and a second conductive lead that each extend from the package, the first conductive lead has a first exposed surface that is greater than a second exposed surface of the second conductive lead.

* * * * *